United States Patent [19]

Tilden

[11] Patent Number: 4,862,138
[45] Date of Patent: Aug. 29, 1989

[54] PROGRAMMABLE COMPARATOR OUTPUT FILTER

[75] Inventor: Mark D. Tilden, Aloha, Oreg.

[73] Assignee: Tektronix, Inc., Beaverton, Oreg.

[21] Appl. No.: 153,165

[22] Filed: Feb. 8, 1988

[51] Int. Cl.[4] .............................................. G06F 7/02
[52] U.S. Cl. .................................................... 340/146.2
[58] Field of Search ................ 340/146.2; 364/715.01, 364/715.09–715.11; 328/111, 112; 307/265

[56] References Cited

U.S. PATENT DOCUMENTS

| | | | |
|---|---|---|---|
| 3,609,683 | 9/1971 | Hoffman et al. | 340/146.2 |
| 3,753,135 | 8/1973 | Kastner et al. | 328/111 |
| 3,790,881 | 5/1974 | Smith | 328/112 |
| 4,191,847 | 3/1980 | Mayer | 328/111 |
| 4,336,593 | 6/1982 | Takase | 340/146.2 |
| 4,418,332 | 11/1983 | Mefford | 340/146.2 |
| 4,775,840 | 10/1988 | Ohmori et al. | 328/111 |

OTHER PUBLICATIONS

Tektronix, 1240 Service Manual, Rev 1985, 4-63→4-66 and Schem 25.
Tektronix, 230 Service Manual, circa 1967, 4-48→4-49.

*Primary Examiner*—Gary V. Harkcom
*Assistant Examiner*—Dale M. Shaw
*Attorney, Agent, or Firm*—Boulden G. Griffith

[57] ABSTRACT

A programmable counter or timer is preloaded with a value that serves to discriminate between meaningful transitions and spurious ones, and an output latch is initialized so that the value it contains is equal to the initial value of a comparator output. The binary output of the comparator is then continuously compared with the content of the output latch. If the two values become unequal, indicating a change in the state of the comparator output, the timer or counter is enabled to start timing or counting. If the change in the comparator output lasts long enough to qualify the transition as meaningful, the timer/counter times out clocking the new comparator output condition into the output latch.

16 Claims, 1 Drawing Sheet

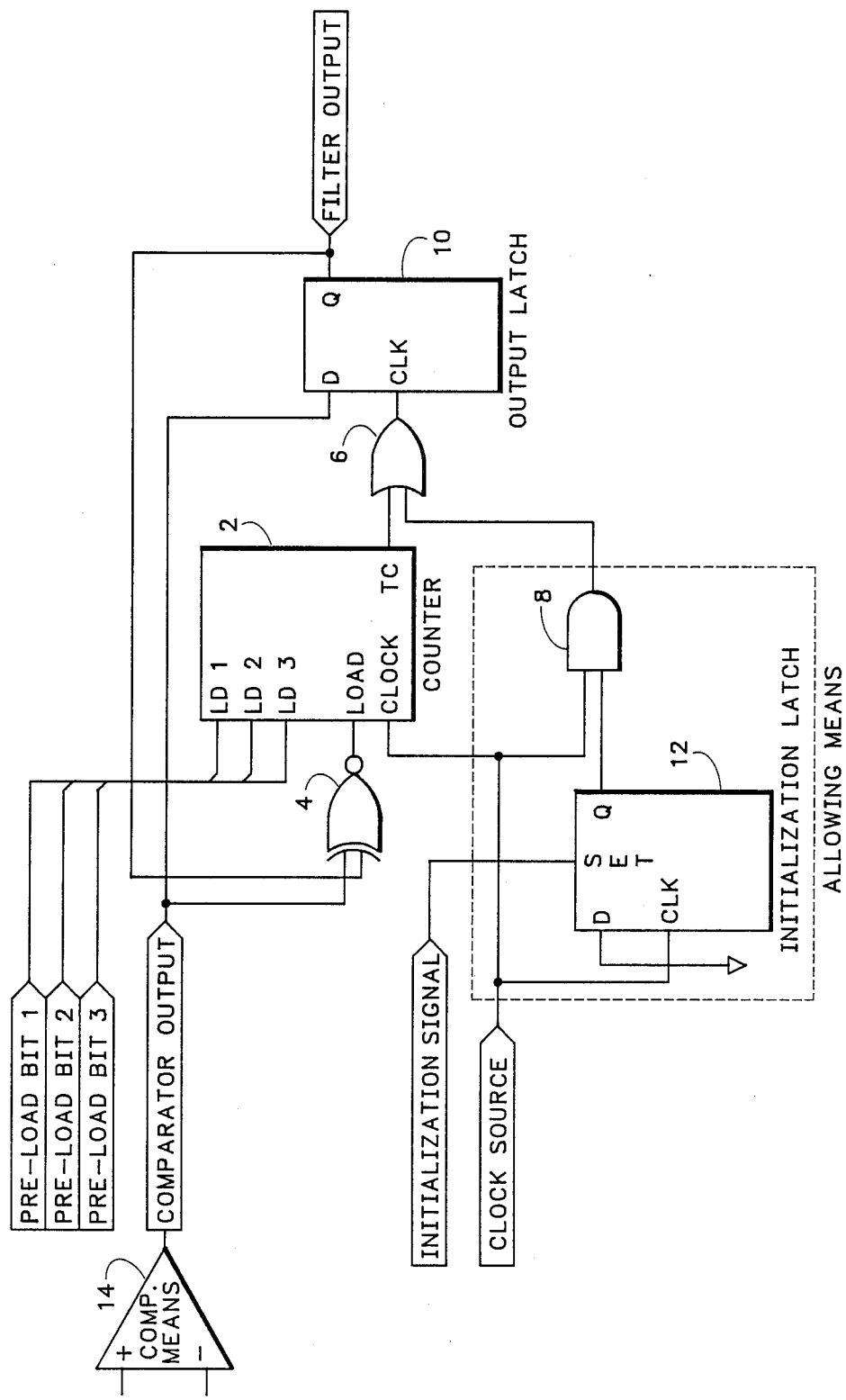

PROGRAMMABLE COMPARATOR OUTPUT FILTER

BACKGROUND OF THE INVENTION

This invention relates to the fields of digital filters and binary threshold detection, and more particularly to a programmable filter used to discriminate between actual transitions in the output of a comparator or threshold detector and false transitions, due to noise or other spurious inputs, that are characterized by their short duration.

When a comparator or threshold detector is used to determine when a signal makes a transition across a voltage threshold, noise can cause short-term transitions which do not reflect the intended operation of the circuitry. This problem is particularly acute where the threshold voltage and the quiescent level of the signal are always close together or where the signal voltage is changing slowly through the threshold voltage so that the two levels are close together for a significant period of time.

What is desired is a way to discriminate between relatively long term transitions in the output of a comparator that are intended by the designer to indicate an actual transition and shorter term transitions that are the result of noise or other spurious events.

SUMMARY OF THE INVENTION

The present invention is a circuit and technique for discriminating between relatively long term transitions in the output of a comparator that are due to meaningful transitions in the relationship of two voltages and shorter term transitions that are presumptively the result of noise or other spurious signals.

A programmable timer or counter is preloaded with a value such that the time that it takes for the timer to time out or the counter to reach its terminal count will serve to discriminate between meaningful transitions and spurious ones. This time should be such that, if a change in the comparator output persists for that length of time it will be treated as an actual transition, but if the change in comparator output does not persist for that length of time it will be ignored as a spurious short term transition. A programmable counter will serve as the timer if the clock period is known.

An output latch is initialized so that the value it contains is equal to the initial binary value of the comparator output.

The binary output of the comparator is then continuously compared by an exclusive OR gate with the content of the output latch. If the two values become unequal, indicating a change in the state of the comparator output, the timer or counter is enabled to start timing or counting. If the change in the comparator output lasts long enough to qualify the transition as meaningful, the timer/counter times out, clocking the new comparator output condition into the output latch. This change causes the output latch and the output of the comparator to be equal again, thereby eliminating the output signal from the exclusive OR gate and resetting the counter or timer.

BRIEF DESCRIPTION OF THE DRAWING

The drawing is a schematic diagram of the invention.

DETAILED DESCRIPTION OF THE INVENTION

Referring to the drawing, a programmable counter 2 has an exclusive OR gate 4 connected to its LOAD input, a clock source connected to its CLOCK input, and its terminal count TC output connected to one of the inputs of a two-input OR gate 6. The load lines LDx of the counter are connected to latches containing a preload value which is the 1's complement of the number of counts which qualify a transition as valid. The counter latches in this value as its starting value and begins counting when the signal on the LOAD input goes low. The TC output goes high if the counter is allowed to count long enough to count up to its terminal count from this preloaded value.

The OR gate 6 receives its other input from a two-input AND gate 8. The output of the OR gate 6 is connected to the clock input of an output latch 10. Output latch 10 receives its D input from the output of a comparator (not shown). The Q output of the output latch 10 is an input to the exclusive OR gate 4, which receives its other input from the output of the comparator 14.

An initialization latch 12 has its clock input connected to the clock source, its D input connected to ground, and its set input connected to an initialization signal input. The output of the initialization latch 12 goes to the other input of the two-input AND gate 8.

In operation, the programmable counter 2 is preloaded with a value such that, if a change in the output of the comparator persists for enough clock pulses for the counter to reach terminal count the transition is deemed to be a real or meaningful transition, whereas if a change in the output of the comparator does not persist for that many counts it is deemed to be noise or a spurious event.

An initialization signal is applied to set the initialization latch 12. While the initialization latch 12 is set, one clock pulse passes through the AND gate 8. However, that same clock pulse causes the initialization latch 12 to reset, since its D input is tied to ground. When the initialization latch is reset the AND gate 8 is disabled, preventing any additional clock pulses from reaching OR gate 6 and the output latch 10.

The one clock pulse that passes through the AND gate 8, also passes on through the OR gate 6 to clock the output of the comparator into the output latch 10. This ensures that the output of the output latch 10 is the same as the output of the comparator when operation begins.

With the output of the comparator and the content of the output latch 10 are equal, the inputs to the exclusive OR gate 4 are equal and its inverted output is high, keeping the counter 2 disabled. However, when the output of the comparator next changes state, the two inputs to the exclusive OR gate 4 become different, causing its inverted output to go low, thereby enabling the counter 2 to begin counting. If the change in the output of the comparator is sufficiently persistent, the counter 2 reaches terminal count and output TC goes high. This high passes through OR gate 6 and clocks the new value of the comparator output into the output latch 10.

When the output latch 10 has changed its content to equal the output of the comparator, the two inputs to the exclusive OR gate 4 are again equal and its inverted output again goes high, disabling and resetting the counter 2. When another apparent transition causes the comparator output to change again, the counter 2 is again enabled by the resulting low signal on the LOAD input to the counter and the counter again begins counting. This time, however, let us assume that the change in the output of the comparator is too brief to allow the counter 2 to reach terminal count. When the output of the comparator changes back to the value being stored in the output latch 10, the exclusive OR gate 4 inverted output reverts to high, interrupting the counter 2 before the terminal count is reached. In this case, no clock reaches the output latch 10 and it never changes state to reflect the temporary change that occurred on the output of the comparator. Thus, it can be seen that for the filtered output of the overall circuit to change, a change on the input must persist for a length of time longer than the product of the clock period and the difference between the preloaded counter value and the terminal count of the counter.

It should be apparent to those of ordinary skill in the art that other logically equivalent circuit elements and configurations could be substituted in the circuit described above, and the same effect achieved, without departing from the scope of the invention as described in the claims which follow. In particular, it should be apparent that this circuit could be used to filter the output of any type of comparator that produces a binary signal output, even if what is compared is considerably more complex than two voltage levels. It is also well known that counters and timers are virtually interchangeable if the period of the clock signals being counted is known.

I claim:

1. A comparator circuit with filtered output comprising:
   means for comparing, having a binary output;
   means for storing a previous output of the comparator;
   programmable means for timing, enabled by differences between the previous output and the binary output, and providing a timer output signal if the differences persist for longer than a programmed value;
   means for changing the contents of the storing means to the value of the binary output of the comparing means, the changing means being responsive to the timer output signal; and
   means for initializing the storing means so that it contains the value of the binary output of the comparing means.

2. A comparator circuit as recited in claim 2 wherein the timing means is a programmable counter operating to count a clock signal.

3. A comparator circuit as recited in claim 2 wherein the initializing means is a means for passing one of the clock signals to the changing means as a substitute for the timer output signal.

4. A digital circuit for filtering a binary output of a comparator comprising:
   programmable means for timing having means for loading a programmable value to be timed, a timer enable input, a timer clock input, and a timer output, with the timer clock input coupled to a clock source, such that the timer output is activated when the number of clocks counted on the timer clock input during the period of an active signal on the timer enable input reaches the value to be timed;
   first means for storing a bit, having a signal input, a store clock input, and a stored value output, with the signal input coupled to the binary output of the comparator, such that upon the occurrence of the store clock input the binary value appearing at the signal input is stored and appears at the stored value output until the time of the next store clock input;
   means for comparing two bits, having two inputs and an output, with the binary output of the comparator coupled to one input and the stored value output of the first bit storing means coupled to the other input and with the output coupled to the timer enable input of the programmable timing means;
   means for allowing one clock pulse from the clock source to pass through in response to an initialization signal, the allowing means having a clock input coupled to the clock source, an initialization input coupled to the initialization signal, and a passed clock output; and
   an OR gate having two inputs and an output, with one input coupled to the passed clock output of the allowing means, the other input coupled to the timer output, and the output coupled to the store clock input of the first bit storing means;
   whereby upon the occurrence of the initialization signal a single clock pulse from the allowing means is passed through the OR gate to the first bit storing means causing the stored value output to assume the value of the binary output of the comparator until a change in the binary output of the comparator causes the output of the bit comparing means to enable the programmable timing means causing the programmable timing means to time so that if the change in the binary output of the comparator persists for a desired timing interval the timer output is activated sending a signal through the OR gate to cause the changed value of the output of the comparator to be stored by the bit storing means.

5. A circuit as recited in claim 4 wherein the programmable means for timing is a programmable digital counter.

6. A circuit as recited in claim 4 wherein the first bit storing means is a latch.

7. A circuit as recited in claim 4 wherein the bit comparing means is an exclusive OR gate.

8. A circuit as recited in claim 4 wherein the allowing means comprises:
   second means for storing a bit having a set input, a data input, a clock signal input, and an initialization output, with the data input coupled to a logical zero signal source, the set input being the initialization input, and the clock signal input being the clock input, such that upon the occurrence of the initialization signal the initialization output becomes a logical one until the next occurrence of the clock signal input at which time the initialization output goes to a logical zero; and
   an AND gate with two inputs and an output, with one input coupled to the initialization output of the second bit storing means, the other input coupled to the clock source, and the output being the passed clock output.

9. A circuit as recited in claim 8 wherein the second bit storing means is a latch.

10. A method for discriminating between desired changes in the output of a comparator and spurious changes in the output of the comparator comprising the steps of:

preloading a means for counting so that before it reaches a terminal count it will count the number of clock pulses that should occur before a change in the output of the comparator is considered valid rather than spurious, initializing a bit holding means to equal the binary value of the output of the comparator, detecting when the binary output of the comparator changes so that it is not equal to the value held by the bit holding means, counting clock pulses that occur while the binary value of the comparator output is not equal to the value held by the bit holding means, and changing the value held by the bit holding means to equal the value of the binary output of the comparator if the counting means reaches the terminal count.

11. A comparator circuit with filtered output comprising:

means for comparing having a binary output;

programmable means for timing having means for loading a programmable value to be timed, a timer enable input, a timer clock input, and a timer output, with the timer clock input coupled to a clock source, such that the timer output is activated when the number of clocks counted on the timer clock input during the period of an active signal on the timer enable input reaches the value to be timed;

first means for storing a bit having a signal input, a store clock input, and a stored value output, with the signal input coupled to the binary output of the comparator, such that upon the occurrence of the store clock input the binary value appearing at the signal input is stored and appears at the stored value output until the time of the next store clock input;

an exclusive OR gate having two inputs and an output, with the binary output of the comparator coupled to one input and the stored value output of the first bit storing means coupled to the other input and with the output coupled to the timer enable input of the programmable timing means;

means for allowing one clock pulse from the clock source to pass through in response to an initialization signal, the allowing means having a clock input coupled to the clock source, an initialization input coupled to the initialization signal, and a passed clock output; and an OR gate having two inputs and an output, with one input coupled to the passed clock output of the allowing means, the other input coupled to the timer output, and the output coupled to the store clock input- of the first bit storing means;

whereby upon the occurrence of the initialization signal a single clock pulse from the allowing means is passed through the OR gate to the first bit storing means causing the stored value output to assume the value of the binary output of the comparator until a change in the binary output of the comparator causes the output of the exclusive OR gate to enable the programmable timing means causing the programmable timing means to time so that if the change in the binary output of the comparator persists for a desired timing interval the timer output is activated sending a signal through the OR gate to cause the changed value of the output of the comparator to be stored by the bit storing means.

12. A circuit as recited in claim 11 wherein the programmable means for timing is a programmable digital counter.

13. A circuit as recited in claim 11 wherein the first bit storing means is a latch.

14. A circuit as recited in claim 11 wherein the bit comparing means is an exclusive OR gate.

15. A circuit as recited in claim 11 wherein the allowing means comprises:

second means for storing a bit having a set input, a data input, a clock signal input, and an initialization output, with the data input coupled to a logical zero signal source, the set input being the initialization input, and the clock signal input being the clock input, such that upon the occurrence of the initialization signal the initialization output becomes a logical one until the next occurrence of the clock signal input at which time the initialization output goes to a logical zero; and an AND gate with two inputs and an output, with one input coupled to the initialization output of the second bit storing means, the other input coupled to the clock source, and the output being the passed clock output.

16. A circuit as recited in claim 15 wherein the second bit storing means is a latch.

* * * * *

UNITED STATES PATENT AND TRADEMARK OFFICE
CERTIFICATE OF CORRECTION

PATENT NO. : 4,862,138

DATED : August 29, 1989

INVENTOR(S) : Mark D. Tilden

It is certified that error appears in the above-identified patent and that said Letters Patent is hereby corrected as shown below:

In claim 2, first line, "claim 2" should be --claim 1--.

Signed and Sealed this

Seventeenth Day of July, 1990

*Attest:*

HARRY F. MANBECK, JR.

*Attesting Officer*  *Commissioner of Patents and Trademarks*